(12) United States Patent
Nicholson et al.

(10) Patent No.: US 9,400,726 B2
(45) Date of Patent: Jul. 26, 2016

(54) POWER USAGE MONITORING OF POWER FEED CIRCUITS USING POWER DISTRIBUTION UNITS

(75) Inventors: Calvin Nicholson, Reno, NV (US); Michael Gordon, Grover, MO (US)

(73) Assignee: Server Technology, Inc., Reno, NV (US)

( * ) Notice: Subject to any disclaimer, the term of this patent is extended or adjusted under 35 U.S.C. 154(b) by 630 days.

(21) Appl. No.: 13/429,004

(22) Filed: Mar. 23, 2012

(65) Prior Publication Data

US 2013/0253861 A1    Sep. 26, 2013

(51) Int. Cl.
*G06F 1/18* (2006.01)
*G06F 1/26* (2006.01)
*G06F 11/30* (2006.01)
*H05K 7/14* (2006.01)

(52) U.S. Cl.
CPC ........ *G06F 11/3003* (2013.01); *G06F 11/3062* (2013.01); *H05K 7/1498* (2013.01); *G06F 1/189* (2013.01); *G06F 1/26* (2013.01)

(58) Field of Classification Search
CPC .... G01R 21/005; G01R 21/006; G01R 21/10; G01R 35/005; H02B 1/011; G06F 1/266; G06F 19/00; G06F 1/189; G06F 1/26; G06F 1/28; G06F 9/505; H01R 25/006
See application file for complete search history.

(56) References Cited

U.S. PATENT DOCUMENTS

| | | | |
|---|---|---|---|
| 7,157,963 B1 * | 1/2007 | Booth et al. | 330/10 |
| 8,450,878 B2 * | 5/2013 | Rada et al. | 307/105 |
| 8,494,661 B2 * | 7/2013 | Ewing et al. | 700/22 |
| 2009/0234512 A1 * | 9/2009 | Ewing et al. | 700/295 |
| 2010/0280774 A1 * | 11/2010 | Ewing et al. | 702/60 |
| 2010/0328849 A1 * | 12/2010 | Ewing et al. | 361/622 |
| 2011/0082599 A1 * | 4/2011 | Shinde et al. | 700/295 |
| 2011/0101777 A1 * | 5/2011 | Jansma | 307/38 |
| 2011/0112701 A1 * | 5/2011 | Johnson et al. | 700/295 |
| 2011/0266870 A1 * | 11/2011 | Hu | 307/39 |
| 2013/0212411 A1 * | 8/2013 | Nicholson et al. | 713/310 |
| 2014/0236372 A1 * | 8/2014 | Ewing et al. | 700/295 |

FOREIGN PATENT DOCUMENTS

| | | |
|---|---|---|
| CN | 102099980 A | 6/2011 |
| JP | H11341706 A | 12/1999 |
| JP | 2011508352 A | 3/2011 |
| WO | WO-2010085816 A1 | 7/2010 |

OTHER PUBLICATIONS

United States Patent & Trademark Office; "Notification of Transmittal of the International Search Report and the Written Opinion of the International Searching Authority, or the Declaration," PCT/US13/33595; Jun. 27, 2013; 10 pp.

* cited by examiner

*Primary Examiner* — Huan Tran
(74) *Attorney, Agent, or Firm* — Perkins Coie LLP

(57) ABSTRACT

A method of monitoring power usage includes 1) accessing power usage data for power distribution unit infeeds of a plurality of power distribution units; 2) accessing stored circuit descriptions describing interconnections of the power distribution unit infeeds to a number of power feed circuits; 3) transforming the plurality of power distribution units into a power usage monitor for monitoring power usage of the power feed circuits by aggregating at least some of the power usage data based on the interconnections of the power distribution unit infeeds to the number of power feed circuits; and 4) outputting representations of the aggregated power usage data.

20 Claims, 17 Drawing Sheets

POWER USAGE MONITORING OF POWER FEED CIRCUITS USING POWER DISTRIBUTION UNITS

BACKGROUND

Computing facilities such as data centers generally include electronic equipment racks, such as standard RETMA racks, that commonly comprise rectangular or box-shaped housings sometimes referred to as cabinets or racks and associated components for mounting equipment, associated communications cables, and associated power distribution cables. Electronic equipment is commonly mounted in such racks so that the various electronic devices are aligned vertically one on top of the other in the rack. Often, multiple such racks are oriented side-by-side, with each containing numerous electronic components and having substantial quantities of associated component wiring located both within and outside the area occupied by the racks. Such racks commonly support equipment that is used in a computing network.

In many cases, computing facilities such as server farms or data centers support large networks, referred to as enterprise networks. Enterprise networks exist to support large worldwide organizations and depend on a combination of technologies, e.g., data communications, inter-networking equipment such as frame relay controllers, asynchronous transfer mode (ATM) switches, routers, integrated services digital network (ISDN) controllers, application servers, and network management application software. Such enterprise networks can be used to support a large company's branch offices or campuses throughout the world and, as such, these networks have become mission critical to the functioning of such organizations. Masses of information are routinely expected to be exchanged, and such information exchanges are necessary to carry on the daily business of modern organizations. For example, some international banks have thousands of branch offices placed throughout Europe, Asia and North America that each critically depend on their ability to communicate banking transactions quickly and efficiently with one another and with their respective headquarters. A typical enterprise network uses building blocks of router and frame relay network appliances mounted in equipment racks. Such equipment racks are distributed to remote point of presence (POP) locations in the particular network. Each equipment rack can include, for example, frame relay controllers, routers, ISDN controllers, servers, network attached storage devices, modems, etc., each of which is connected to one or more power sources.

Many equipment racks may be located in a data center, with each rack having one or more associated power distribution units (PDUs). One or more such data centers may serve as data communication hubs for an enterprise. On the other hand, more than one enterprise may use computing facilities in a single data center. In any event, a particular enterprise and/or a particular data center may have a large number of equipment racks and associated PDUs.

A conventional PDU is an assembly of electrical outlets (also called receptacles) that receive electrical power from a source and distribute the electrical power to one or more separate electrical appliances. Each electrical appliance has one or more power cords plugged into one or more of the outlets. A PDU also typically has a power cord, which cord can be directly hard wired to a power source or plugged into a power source using a traditional plug and receptacle connection. PDUs are used in many applications and settings such as, for example, in or on electronic equipment racks. One or more PDUs are commonly located in an equipment rack or other cabinet, and may be installed together with other devices connected to the PDU, such as environmental monitors, temperature and humidity sensors, fuse modules or communications modules that may be external to or contained within the PDU housing. A PDU that is mountable in an equipment rack or cabinet may sometimes be referred to as a cabinet PDU, or "CDU" for short.

PDUs have been provided with sensors that enable them to sense power usage at their input or outputs, or environmental conditions like temperature and humidity. PDUs have also been provided with various displays, indicators and alarm mechanisms that enable the PDUs to report or indicate the status of power usage and environmental conditions locally, and with communication interfaces that enable the PDUs to report or indicate the status of power usage and environmental conditions to a network power manager (i.e., a power manager connected to a PDU across a network). In this manner, the power usage and environmental information may be used to monitor power usage and environmental conditions of both the PDU and the equipment it powers. In some cases, the power distributed by a PDU may also be controlled (e.g., power to its outlets may be turned off or on).

BRIEF DESCRIPTION OF THE DRAWINGS

Illustrative embodiments of the invention are illustrated in the drawings, in which:

FIGS. 8-15 illustrate various screen images of a graphical user interface used by a power usage monitoring system;

DETAILED DESCRIPTION

Disclosed herein are systems, devices, methods, and software for monitoring the power usage of power feed circuits that supply power to power distribution units. In some cases, the power distribution units may be mounted in or on the equipment racks of a data center and may be referred to as "rack-mounted power distribution units" or "rack-mounted PDUs."

This description provides examples, and is not intended to limit the scope, applicability or configuration of the invention. Rather, the ensuing description will provide those skilled in the art with an enabling description for implementing embodiments of the invention.

Various changes may be made in the functions and arrangements of the procedures and elements disclosed herein. Thus, various embodiments may omit, substitute, or add various procedures or elements as appropriate. For instance, it should be appreciated that the disclosed methods may be performed in orders different than those described, and various steps may be added, omitted or combined. Also, aspects and elements described with respect to certain embodiments may be combined in various other embodiments. It should also be appreciated that the following systems, methods, devices, and software may individually or collectively be components of a larger system, wherein other procedures or elements may take precedence over or otherwise modify their application.

The following patents and patent applications are incorporated herein by reference in their entirety: U.S. patent application Ser. No. 12/344,419, entitled "Power Distribution, Management, and Monitoring Systems and Methods," filed on Dec. 26, 2008; and U.S. patent application Ser. No. 12/717,879, entitled "Monitoring Power-Related Parameters in a Power Distribution Unit," filed on Mar. 4, 2010.

Figure 1:
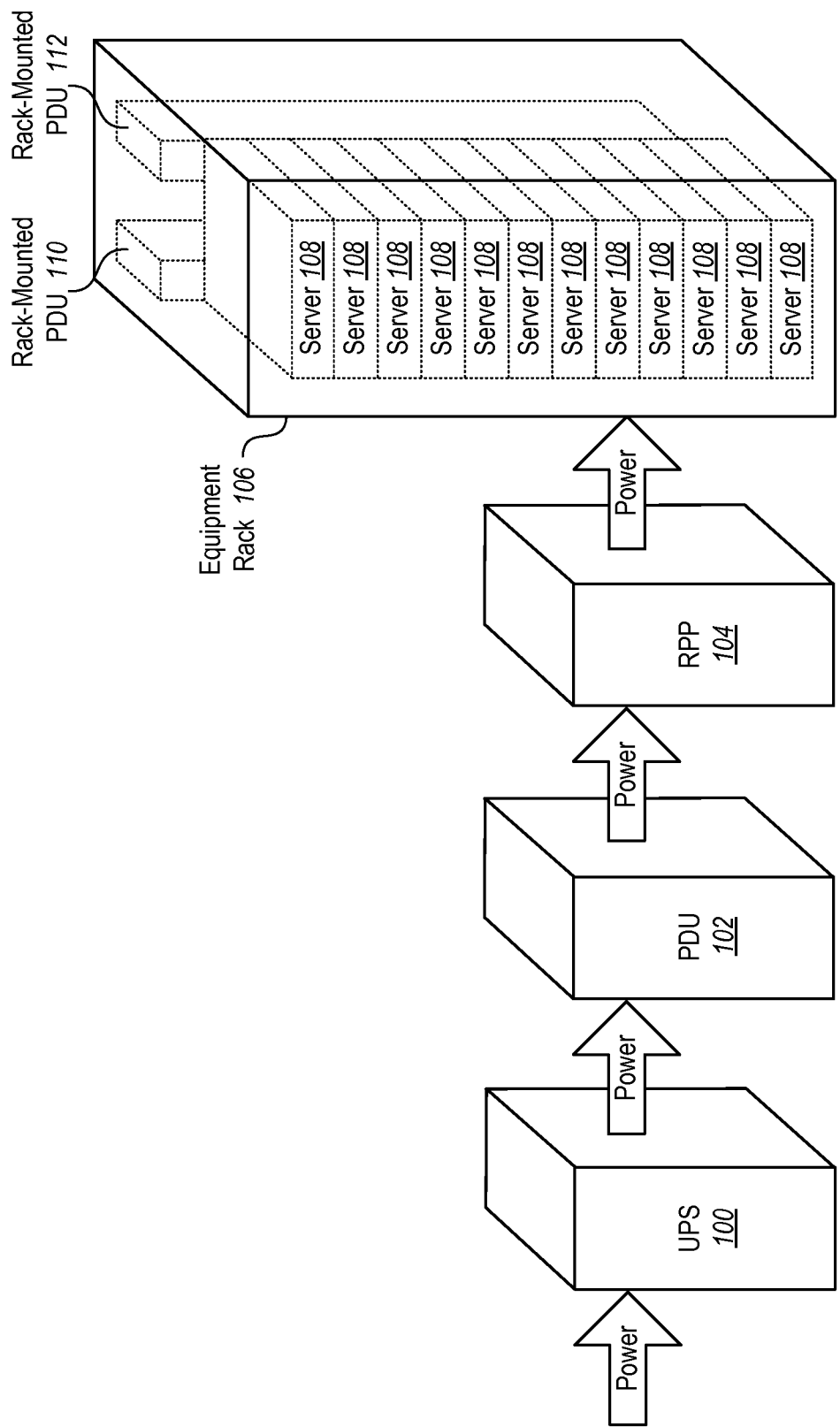
FIG. 1 provides an example of how power may be distributed to a server, electrical appliance or device housed in a data center.

FIG. 1 provides an example of how power may be distributed to a server 108, electrical appliance or device housed in a data center. In this example, power is received into the data center from a power utility and provided via input switch gear and distribution components (e.g., voltage switches, regulators and distribution panels) to an uninterruptible power supply (UPS) 100. Alternately, power is provided to the UPS 100 via a battery backup source.

Power received by the UPS 100 is routed to a PDU 102, typically floor-mounted, that is capable of supplying power to the servers 108 and other electrical components mounted in several electrical equipment racks 106. The form and purpose of the PDU 102 differs from the form and purpose of the rack-mounted PDUs 110, 112.

The power provided by the floor-mounted PDU 102 is received and distributed at a structure such as a Remote Power Panel (RPP) 104 or Critical Power Panel (CPP). The RPP 104 receives power at an infeed and distributes the power to a plurality of power feed circuits (also known as branch circuits). Each of the power feed circuits is connected to the infeed of the RPP 104 via one or more circuit breakers of the RPP 104. The power feed circuits may take single-phase or polyphase (e.g., two-phase or three-phase) forms, and a single RPP 104 may divide its received power (typically three-phase power) amongst various combinations of single-phase and polyphase power feed circuits. A single-phase power feed circuit (or single phase of power in a polyphase power feed circuit) is typically referred to as a line of power. A single-phase power feed circuit therefore provides one line of power; a two-phase power feed circuit provides two lines of power; and a three-phase power feed circuit provides three lines of power.

Power is provided from the RPP 104 to a plurality of rack-mounted PDUs 110, 112 and/or other electrical components. The rack-mounted PDUs 110, 112 may take single-phase or polyphase forms, and may therefore be connected to different types of power feed circuits. Although FIG. 1 shows only a single electrical equipment rack 106 having two PDUs 110, 112 mounted therein, a power feed circuit would typically provide power to several PDUs mounted in several electrical equipment racks. The power received at an infeed of a PDU 110 or 112 (sometimes referred to herein as a "rack-mounted power distribution unit infeed") is then distributed to one or more servers 108, electrical appliances or devices.

Figure 2:
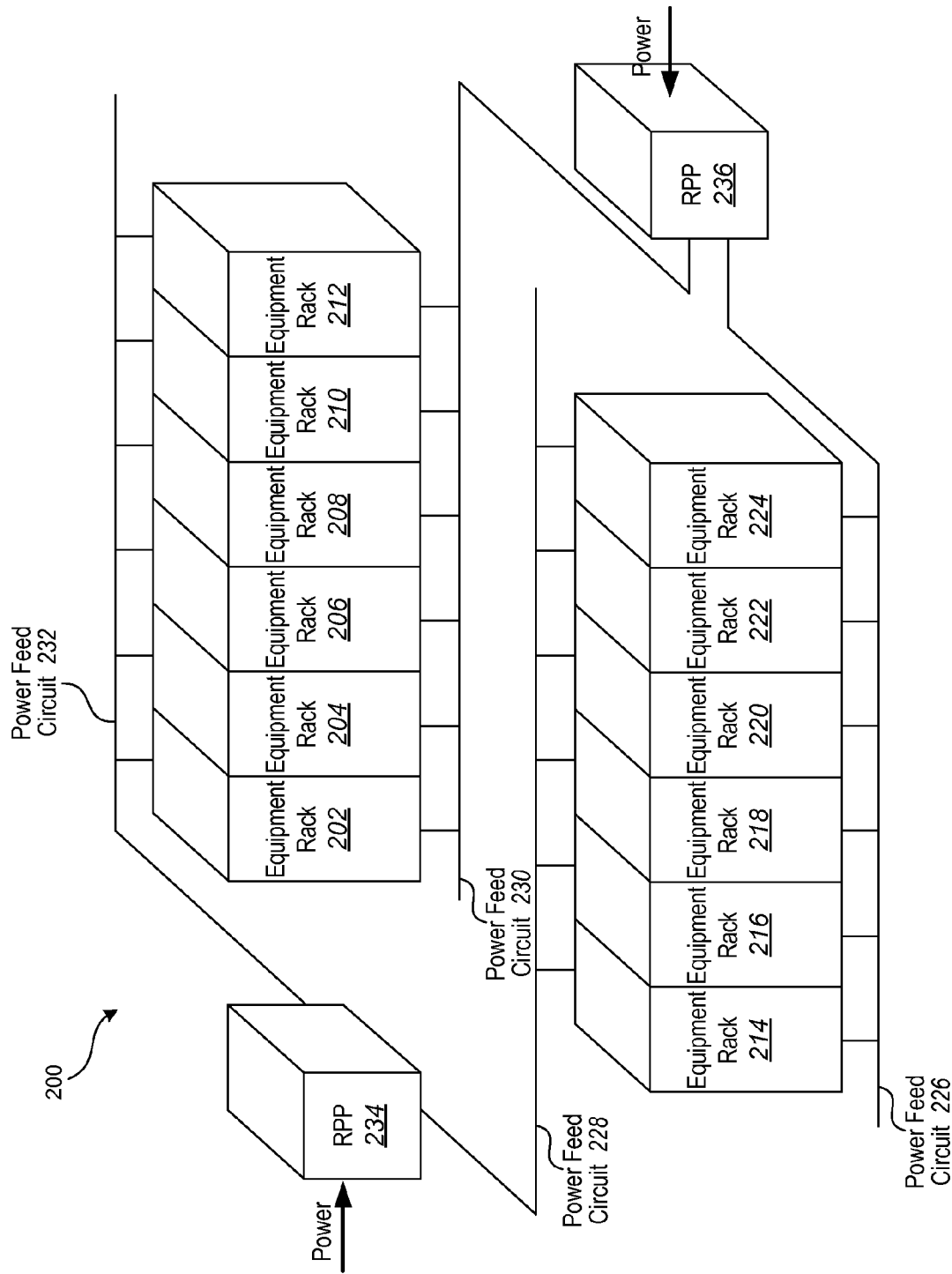
FIG. 2 provides an example of a layout for a data center housing several electrical equipment racks.

FIG. 2 provides an example layout of a data center 200 housing several electrical equipment racks 202, 204, 206, 208, 210, 212, 214, 216, 218, 220, 222, 224. Although the example layout includes twelve electrical equipment racks 202-224, a data center may alternately house more or fewer electrical equipment racks. Typically, a data center would house many more electrical equipment racks.

Figure 3:
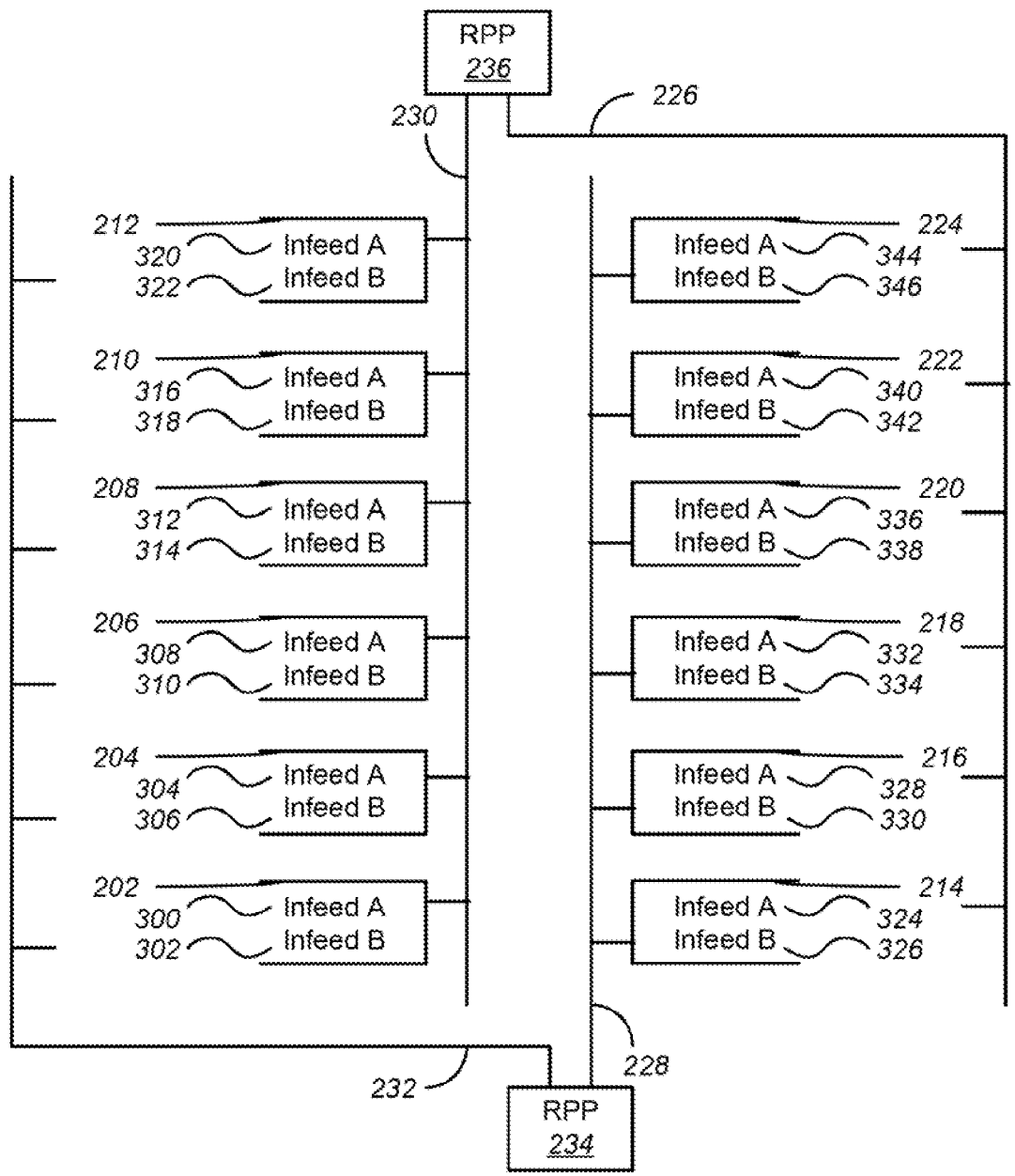
FIG. 3 shows how the infeeds of PDUs mounted in the racks shown in FIG. 2 might be connected to a number of power feed circuits.

In the example layout, four power feed circuits 226, 228, 230, 232 are derived from two RPPs 234, 236. The power feed circuits 226, 228, 230, 232 deliver power to twelve electrical equipment racks 202-224. Two of the power feed circuits 226, 228 are single-phase circuits, and two of the power feed circuits 230, 232 are three-phase circuits. Connections of the power feed circuits 226-232 to infeeds 300, 302, 304, 306, 308, 310, 312, 314, 316, 318, 320, 322, 324, 326, 328, 330, 332, 334, 336, 338, 340, 342, 344, 346 of PDUs mounted in the electrical equipment racks 202-224 are shown in FIG. 3.

Typically, each electrical equipment rack 202-224 (or cabinet) is provided with two PDUs, each of which receives power from a different power source (e.g., RPP 234 or 236) and feed circuit 226-232. See, FIG. 3. Thus, a first PDU may have an "A" infeed 300 that receives power from a first power feed circuit 230, and a second PDU may have a "B" infeed 302 that receives power from a second power feed circuit 232, thereby providing an electrical equipment rack 202 with power redundancy from independent/different power sources. Typically, to ensure the availability of redundant power in the case of PDU failure, each PDU mounted within an electrical equipment rack is only loaded to about 40% of its power handling capacity.

Figure 4:
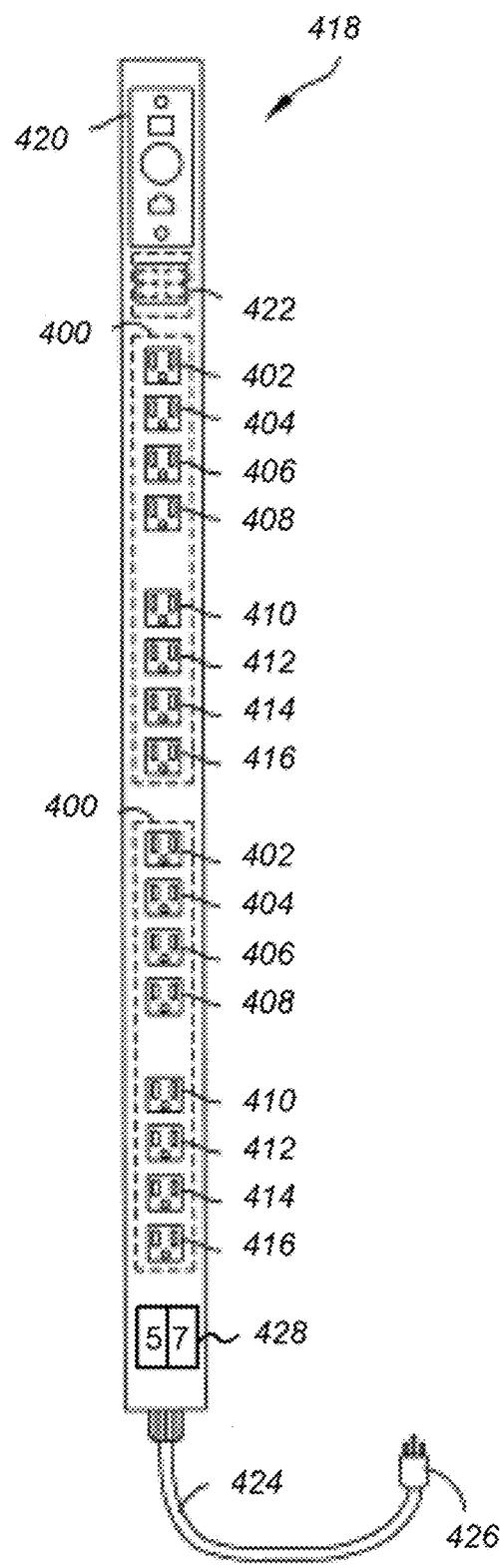
FIG. 4 provides an example of a rack-mounted PDU.

FIG. 4 shows an example of a rack-mounted PDU 418. The PDU 418 includes Intelligent Power Modules (IPMs) 400, along with a communications module 420 that provides communication functions, an environmental monitor 422, and an input power cord 424 with associated plug 426. The PDU 418 according to this embodiment includes a housing that is vertically mountable in an equipment rack, although it will be understood that other form factors may be used, including a horizontally mountable housing. The IPMs 400 each include eight outlets 402-416 that supply power to assets mounted in an electrical equipment rack. Such equipment racks are well known, and often include several individual assets that are used in operation of a data center. As is well known, numerous equipment racks may be included in a data center, and in various embodiments each asset in each equipment rack may be monitored for power usage through one or more associated IPMs 400. The visual display 428 (shown displaying the numeral "57") is disposed in the PDU 418, although in other embodiments the display might be external to the PDU 418 or not provided.

In one embodiment, the power outlet module 400 includes eight outlets (402-416), each of NEMA 5-20R type, contained in a housing. It will be understood that this embodiment, and other embodiments described herein as having NEMA 5-20R type outlets, are exemplary only. In other embodiments, various other types of outlets can be alternately or additionally provided. For example, the "outlets" can be other NEMA types (e.g., NEMA 5-15R, NEMA 6-20R, NEMA 6-30R or NEMA 6-50R) or any of various IEC types (e.g., IEC C13 or IEC C19). It will also be understood that all "outlets" in a particular power outlet module 400, or other module-outlet described herein, need not be identical or oriented uniformly along the PDU 418. It also will be understood that the "outlets" are not limited to three-prong receptacles; alternatively, one or more of the "outlets" can be configured for two or more than three prongs in the mating male connector. It will also be understood that the "outlets" are not limited to having female prong receptacles. In any "outlet," one or more of the "prong receptacles" can have a male or female configuration, as conditions or needs indicate. In general, and as used herein, female and male "prong receptacles" are termed "power-connection elements". Furthermore, the principles described herein are also applicable to devices that may be hard-wired into an outlet module. While outlet module 400 of this embodiment includes eight outlets, it will be understood that this is but one example and an outlet module may alternately include a different number of outlets.

The housing for an outlet module may be any suitable housing for such a device, as is known to one of skill in the art, and may be assembled with other modules in a PDU. Such a housing generally includes a front portion and a rear portion, the front portion of which is substantially planar, and the rear portion of which is substantially planar and parallel to the front portion. The housing may also include longitudinally extending side portions and transverse end portions. The front portion, rear portion, side portions, and end portions are generally orthogonal to each other in a generally rectangular or box-type configuration. The housing can be made of any suitable, typically rigid, material, including, for example, a rigid polymeric ("plastic") material. In at least certain embodiments, the front and rear portions are made from an electrically insulative material, whereas in other embodiments conducting materials are used for safe ground bonding. The side portions and the end portions may be integrally formed, optionally along with the front portion or the rear portion. Furthermore, while the outlet module described in this embodiment includes a housing, other embodiments may include an outlet module that does not include a housing. For example, an outlet module may include a number of outlets coupled together with no exterior housing, which may then be installed into another piece of equipment.

Each outlet 402-416 is interconnected to the power source (directly or indirectly) through any of a number of well known connection schemes, such as connection schemes using spade, lug, plug, screw, or other suitable types of connectors. Furthermore, if desired, one or more of these electrical connectors can be located inside the housing or outside the housing, in embodiments where the power outlet module includes a housing.

Figure 5:
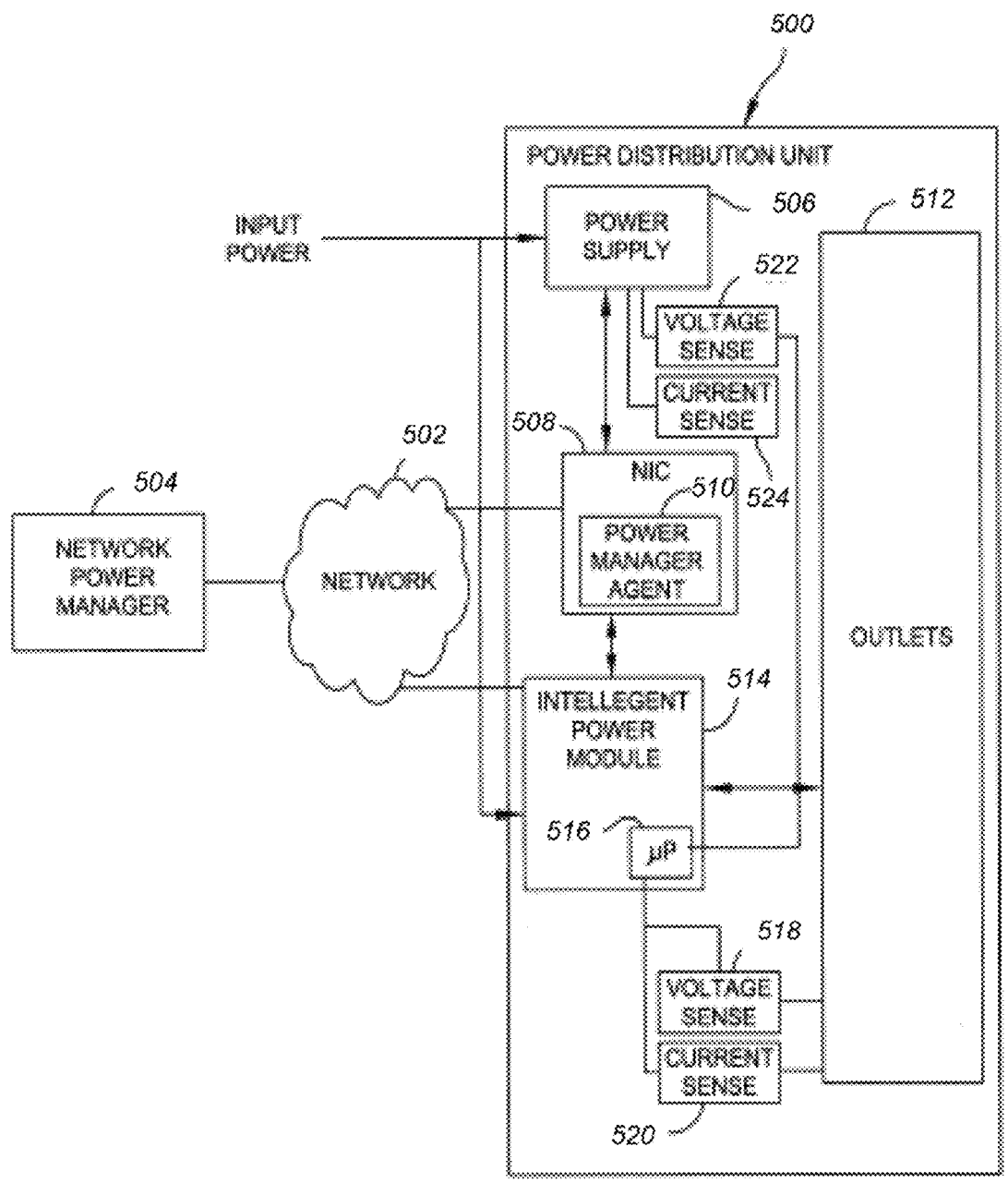
FIG. 5 shows how a plurality of rack-mounted PDUs might be coupled to a network power manager over a network.

In some cases, a rack-mounted PDU having a network communication interface may be coupled to a network power manager over a network (e.g., over an Ethernet or the Internet), as shown in the block diagram of FIG. 5. A plurality of such PDUs may be coupled to the network power manager, in the same or different ways. In this manner, characteristics of the PDUs may be remotely configured, monitored or controlled over the network using the network power manager. The network power manager may take the form of a software tool residing on a desktop or notebook computer, server or mobile device (e.g., a phone, tablet or pad).

With reference to FIG. 5, an example block diagram of a PDU is shown and described. The PDU 500 supplies power to one or more associated computing assets. The PDU 500 is useable in a computer network 502, and may communicate over the computer network 502 with a network power manager 504. The network power manager 504 may reside on or be virtualized on a server, workstation or other device that is used in the management of a data center or other enterprise management. The network power manager 504 issues network commands over a network communications connection. The PDU 500 of this embodiment includes a power supply 506, a network interface card (NIC) 508 that has application firmware and hardware that interfaces to network the PDU 500 with other modules within the PDU, and a power manager agent application 510. The PDU 500 further includes a plurality of power outlets 512 arranged in a power distribution plugstrip, and an intelligent power module (IPM) 514. The IPM 514, NIC 508, and power manager agent 510 are connected to the computer network 502. The intelligent power module 514 controls the application of power from the input power to a corresponding power outlet or outlets among the power outlets 512, and is in communication with the power manager agent application 510 to provide power and power cycling on-off for one or more of the corresponding power outlets. The IPM 514 may also provide power state sensing and/or load-sensing with respect to the corresponding power outlet(s) in response to one or more commands. The IPM 514 in this embodiment includes a microprocessor 516 used to control the power applied to a corresponding power outlet. The microprocessor 516 is also connected to a voltage sensing device 518 and a current sensing device 520 to sense the voltage and current at corresponding individual power outlet(s). The microprocessor 516 uses this information to determine the power supplied to an outlet, as will be described in more detail below. The microprocessor 516 also receives a power measurement from the input power supply 506 through an input voltage sensing device 522 and an input current sensing device 524.

The network power manager 504 of FIG. 5 communicates with the power manager agent 510 and IPM 514. The network power manager 504 may receive information from, and provide instructions to, the IPM 514 and power manager agent 510. The network power manager 504 may also receive related power measurements from the IPM 514 and report power information related to the PDU 500 and one or more individual outlets (and thus power information for individual assets powered by the outlet) of the PDU 500.

As disclosed in FIG. 5, and as further disclosed in U.S. patent application Ser. No. 12/344,419, a network power manager may receive power usage data for the power input(s) of a PDU and use the power usage data to monitor the PDU and its power usage. This may include, for example, monitoring the balance of power phases within the PDU. Monitoring the balance of power phases is useful, for example, in understanding how to reduce the power usage of the PDU and mitigate the likelihood of overheating. Disclosed herein are systems, methods, software and devices that use the power usage data obtained for a number of PDUs to monitor power usage external to the PDUs, such as the power usage of power feed circuits that supply power to multiple PDUs.

In some cases, the PDU 500 may include other components or modules, such as fuse modules, environmental monitors, and communications modules.

Figure 6:
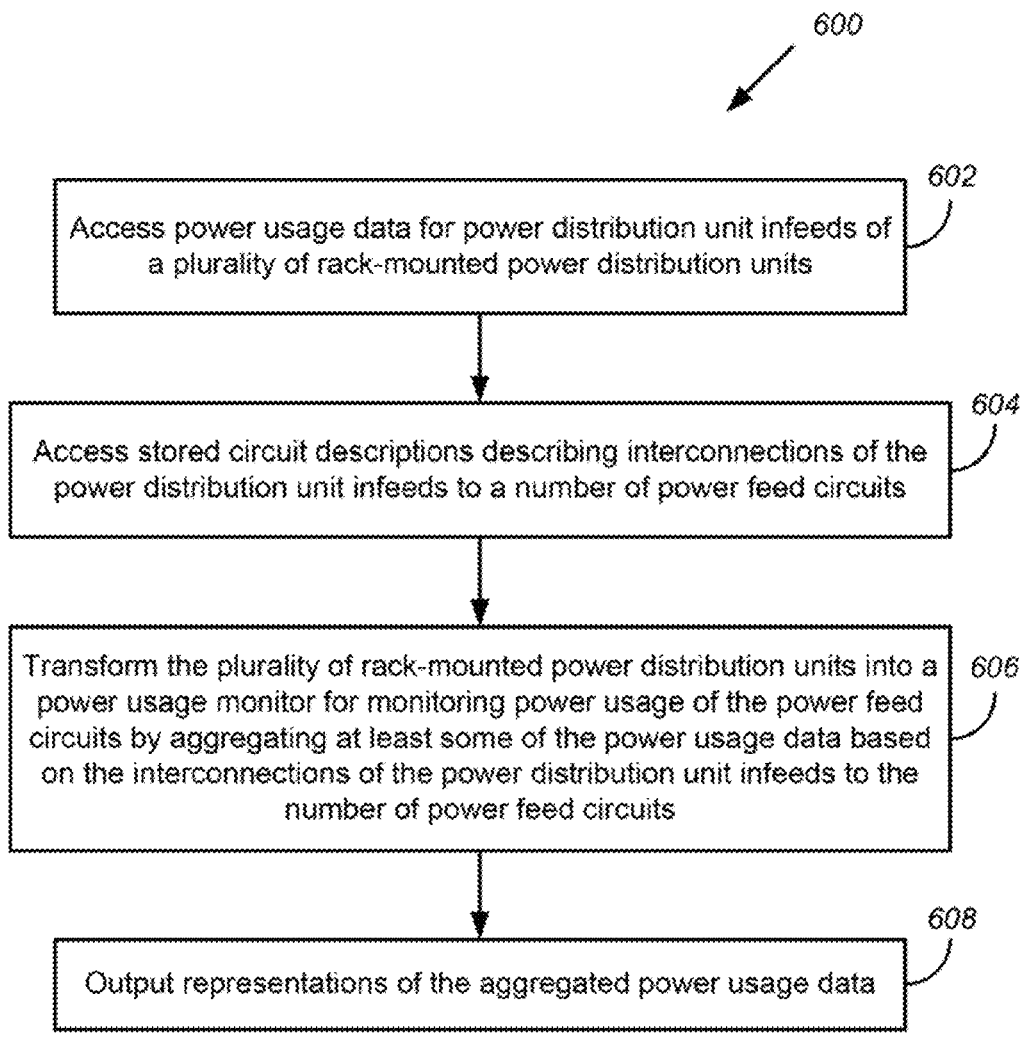
FIG. 6 provides an example of a method for monitoring power usage.

FIG. 6 provides an example of a method 600 for monitoring power usage. By way of example, the method can be performed by the network power manager shown in FIG. 5. At block 602, the method 600 accesses power usage data for power distribution unit infeeds of a plurality of rack-mounted power distribution units. The power usage data may comprise, for example, power readings or current readings taken at the infeeds of the plurality of PDUs. In one embodiment, the power usage data may include power usage data for the infeeds of the PDUs included in the electrical equipment racks shown in FIGS. 2 & 3. At block 604, the method 600 accesses stored circuit descriptions that describe interconnections of the power distribution unit infeeds to a number of power feed circuits. In one embodiment, the circuit descriptions may describe the interconnections of the PDU infeeds and power feed circuits shown in FIG. 3.

At block 606, the method 600 transforms the plurality of rack-mounted power distribution units into a power usage monitor for monitoring the power usage of the power feed circuits. The transformation is accomplished by aggregating at least some of the power usage data based on the interconnections of the rack-mounted power distribution unit infeeds to the number of power feed circuits. For example, in one embodiment, power usage data is respectively aggregated for the infeeds of each respective power feed circuit shown in FIG. 3. Power usage data may also be aggregated based on the interconnections of PDU infeeds to particular lines of power. Aggregating power usage data by line of power can be especially helpful in determining the distribution of power (e.g., balance or unbalance of power) between phases of a polyphase power feed circuit. By way of example, power usage data may be aggregated by adding it.

At block 608, the method 600 outputs representations of the aggregated power usage data. Outputting the representations of aggregated power usage data may take the form of displaying, storing or transmitting the representations. The representations of the aggregated power usage data may take different forms, and in some cases may include power usage values (e.g., analog or digital representations of power usage values) or power usage status indicators (e.g., analog or digital representations indicating that power is being used, or that usage thresholds have been met or exceeded). As mentioned, the aggregated power usage data can convey the power usage for a line of power or power feed circuit. Alternately, power usage data can be aggregated for the infeeds of a single PDU, a single cabinet, a row of cabinets, or any other combination of infeeds or PDUs.

Figure 7:
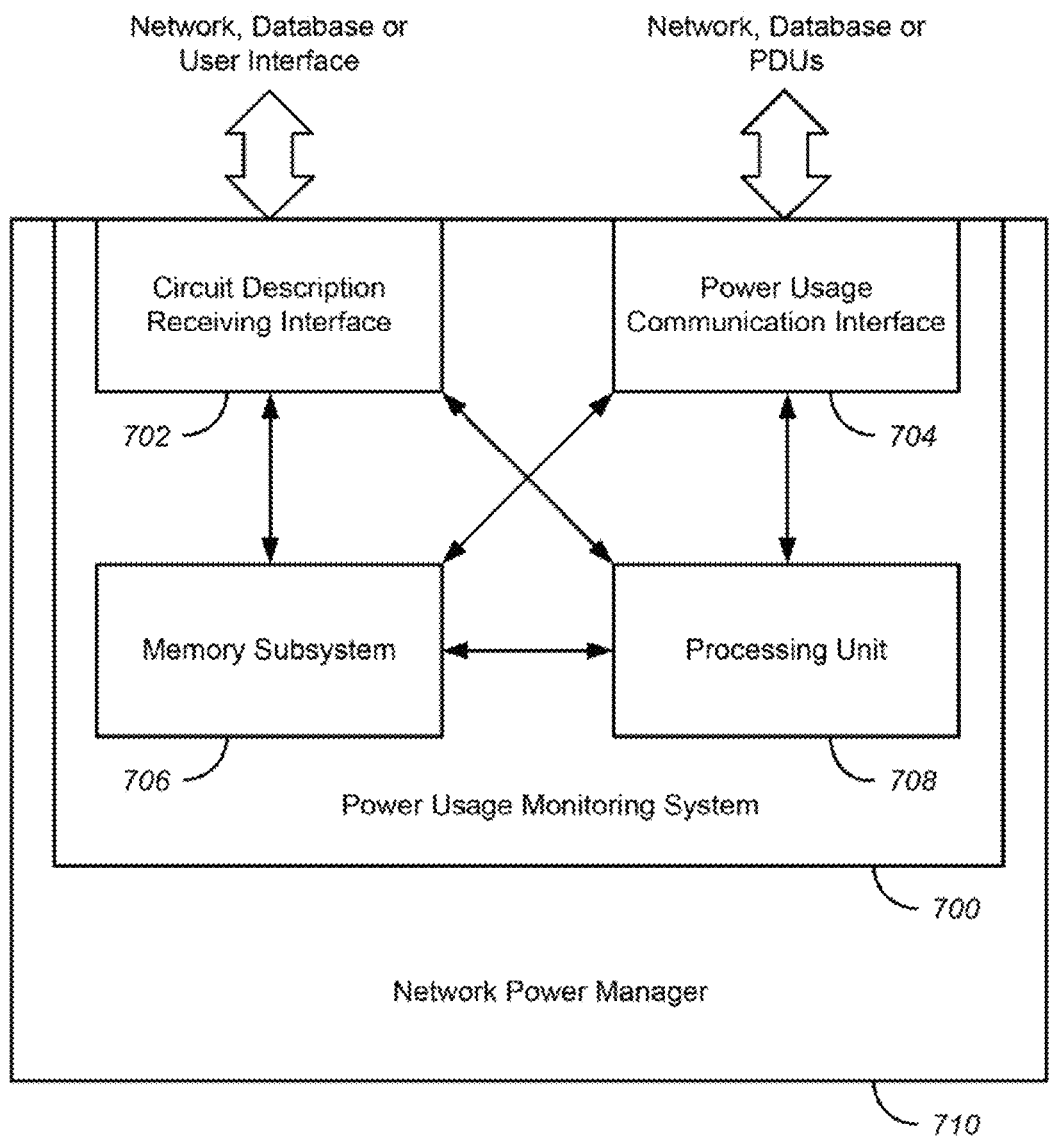
FIG. 7 provides an example of a power usage monitoring system.

FIG. 7 provides an example of a power usage monitoring system 700 comprising a circuit description receiving interface 702, a power usage communication interface 704, a memory subsystem 706 and a processing unit 708. By way of example, the power usage monitoring system 700 is shown to be part of a network power manager 710, such as the network power manager shown in FIG. 5.

The circuit description receiving interface 702 receives a number of circuit descriptions that describe interconnections of rack-mounted power distribution unit infeeds to a number of power feed circuits. The power usage communication interface 704 receives power usage data for the rack-mounted power distribution unit infeeds. The memory subsystem 706 stores the received circuit descriptions and the power usage data.

The processing unit 708 is interconnected with the circuit description receiving interface 702 and the power usage communication interface 704 and is programmed to receive the number of circuit descriptions and the power usage data. In some cases, the interfaces 702, 704 may be provided, at least in part, by configuring or programming the processing unit 708 to assume one or more different physical states. The processing unit 708 is also programmed to aggregate at least some of the power usage data based on the interconnections of the rack-mounted power distribution unit infeeds to the number of power feed circuits. The processing unit 708 is further programmed to output representations of the aggregated power usage data.

In some embodiments, part or all of the processing unit 708 and interfaces 702, 704 may be provided as part of, or on, a common integrated circuit or printed circuit board. Part or all of the memory subsystem 706 may also be provided on the integrated circuit or printed circuit board. Alternately, the elements of the power usage monitoring system 700 may be provided as separate but interconnected components. By way of example, the processing unit 708 may take the form of one or more microprocessors, digital signal processors, or microcontrollers. Also by way of example, the memory subsystem 706 may comprise both a memory and a memory controller. The memory may comprise, for example, one or more devices for storing data, including random access memory (RAM), magnetic RAM, read only memory (ROM), magnetic disk storage mediums, optical storage mediums, flash memory devices, main memory, core memory, cache memory, or other computer-readable mediums for storing information. In some embodiments, the components of the power usage monitoring system 700 may, individually or collectively, be implemented with one or more Application Specific Integrated Circuits (ASICs) adapted to perform some or all of the applicable functions in hardware. Alternatively, the functions may be performed by one or more other processing units (or cores), on one or more integrated circuits. In other embodiments, other types of integrated circuits may be used (e.g., Structured/Platform ASICs, Field Programmable Gate Arrays (FPGAs) and other Semi-Custom ICs), which may be programmed in any manner known in the art. The functions of each unit may also be implemented, in whole or in part, with instructions embodied in a memory, formatted to be executed by one or more general or application-specific processing units.

In some embodiments, some or all of the elements of the power usage monitoring system 700 may be provided as part of the network power manager shown in FIG. 5, and may provide structures and functionality that facilitate power usage monitoring internal and external to a PDU (e.g., for branch circuits internal to the PDU, and for power feed circuits external to the PDU). The elements of the power usage monitoring system 700 may also provide structures and functionality for remotely configuring, monitoring or controlling the PDU via the network power manager. In some cases, the elements of the power usage monitoring system 700 may be provided as elements of a server computer.

The circuit description receiving interface 702 may in some cases receive circuit descriptions that directly associate rack-mounted power distribution unit infeeds with power feed circuits. In other cases, the circuit descriptions may indirectly associate rack-mounted power distribution unit infeeds with power feed circuits. For instance, the circuit descriptions may associate PDU infeeds with particular lines of the power feed circuits, or the circuit descriptions may associate PDUs with power feed circuits. In these instances, the processing unit may be programmed to access or acquire correlations of power feed circuits and the lines thereof, or correlations of PDUs and PDU infeeds.

The processing unit 708 may communicate with a number of PDUs over a network, via the power usage communication interface 704. In this manner, the processing unit 708 may acquire/receive power usage data from the PDUs. The processing unit 708 may also, or alternately, communicate (via the power usage communication interface 704) with a data store in which some or all of the power usage data is stored.

In some embodiments, the power usage monitoring system 700 may further comprise a display on which the representations of the aggregated power usage data are displayed. By way of example, the display may include a cathode ray tube (CRT), liquid crystal display (LCD), desktop or laptop computer display, or mobile phone display. In some cases, the processing unit 708 can be programmed to output the representations of the aggregated power usage data as data points for generating a trend chart on the display, or as data points for generating a phase distribution chart on the display. Particular examples of such a trend chart and phase distribution chart will be provided later in this description.

Representations of the aggregated power usage data may be conveyed to a user locally or remotely. For example, the representations may be displayed on a display that is local to a server that provides a network power manager; or the representations may be transmitted over a network for display by a remote computer or mobile phone.

The representations of the aggregated power usage data may include, for example, power usage values or power usage status indicators. Power usage values may include, for example, power or current values, with or without units. Power usage status indicators may include, for example, single or multi-bit status descriptors, or instructions to set or reset light emitting diode (LED) status indicators, audible alarms, or status indicators included within a display.

FIGS. 8-15 illustrate screen images 800, 900, 1000, 1100, 1200, 1300, 1400, 1500 of a graphical user interface (GUI) 820. The GUI 820 may be provided by, or in conjunction with, a power usage monitoring system. Some of the screen images may be considered part of the circuit description receiving interface of a power usage monitoring system (or may be considered to expose the circuit description receiving interface to a user). These screen images (e.g, the screen images shown in FIGS. 8-13) may provide graphical tools that enable a user to associate PDU infeeds with power feed circuits and/or lines of the power feed circuits. The screen images shown in FIGS. 14 & 15 may be considered part of an output interface of a power usage monitoring system.

Figure 8:
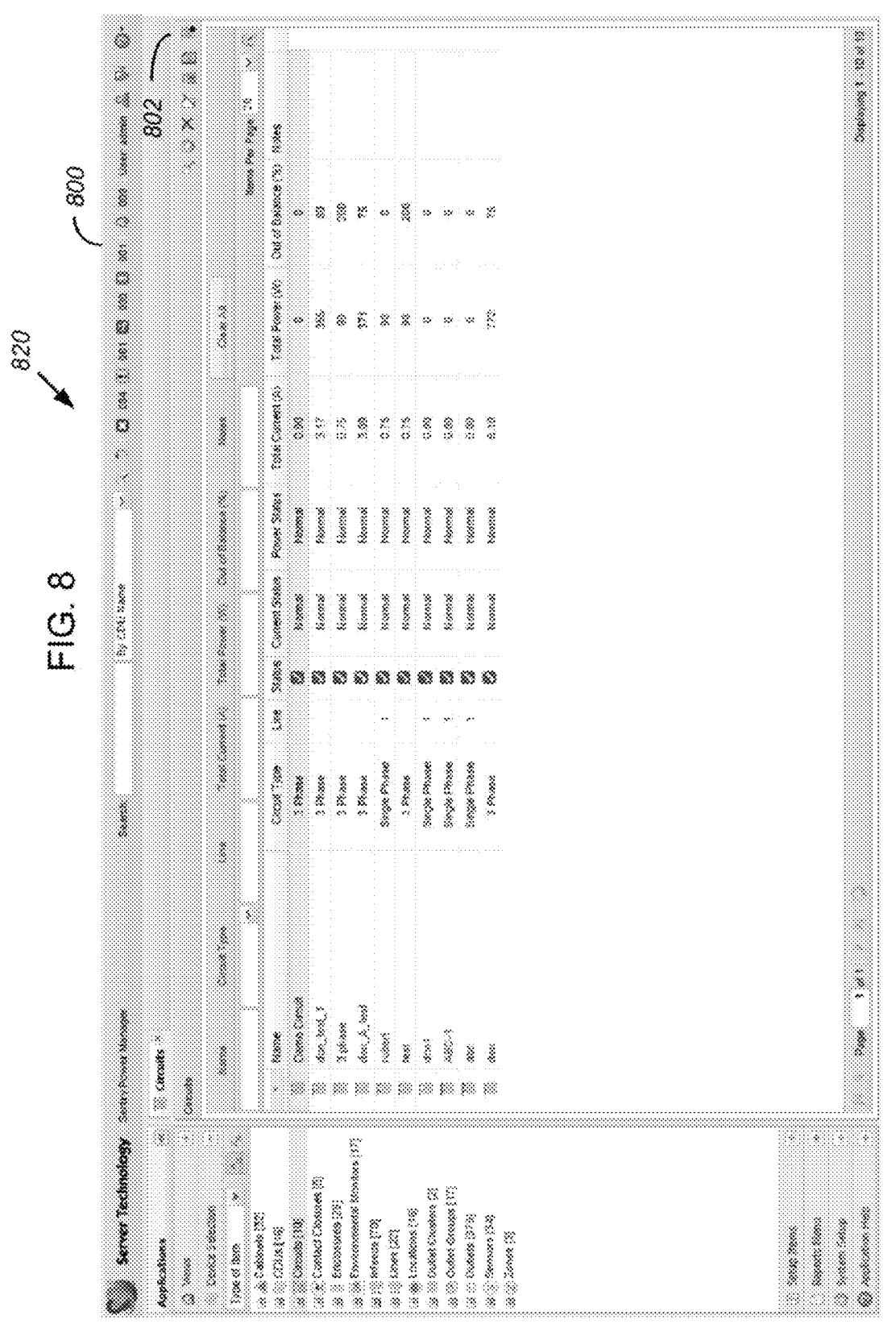
Figure 9:
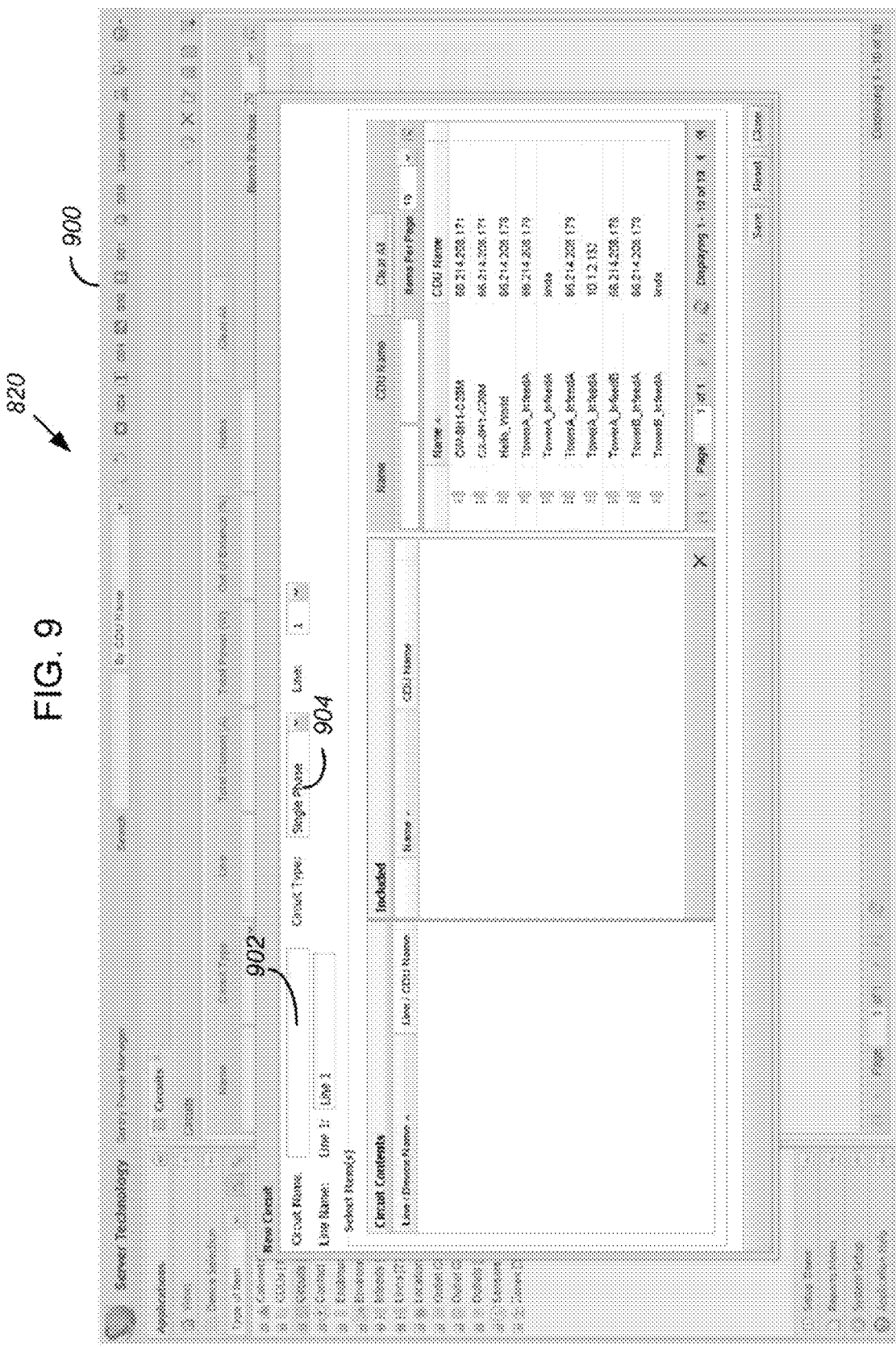
Figure 10:
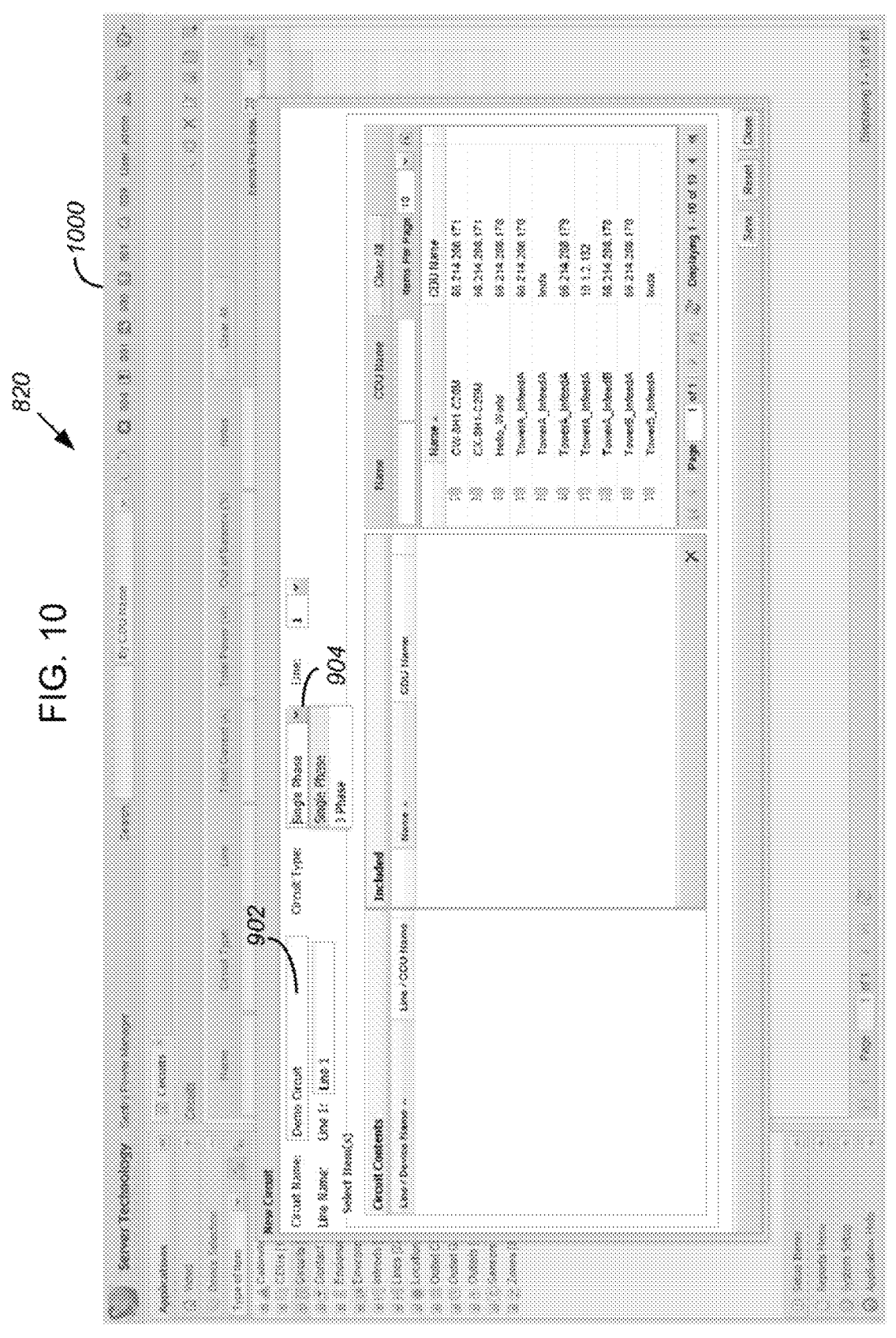
Figure 11:
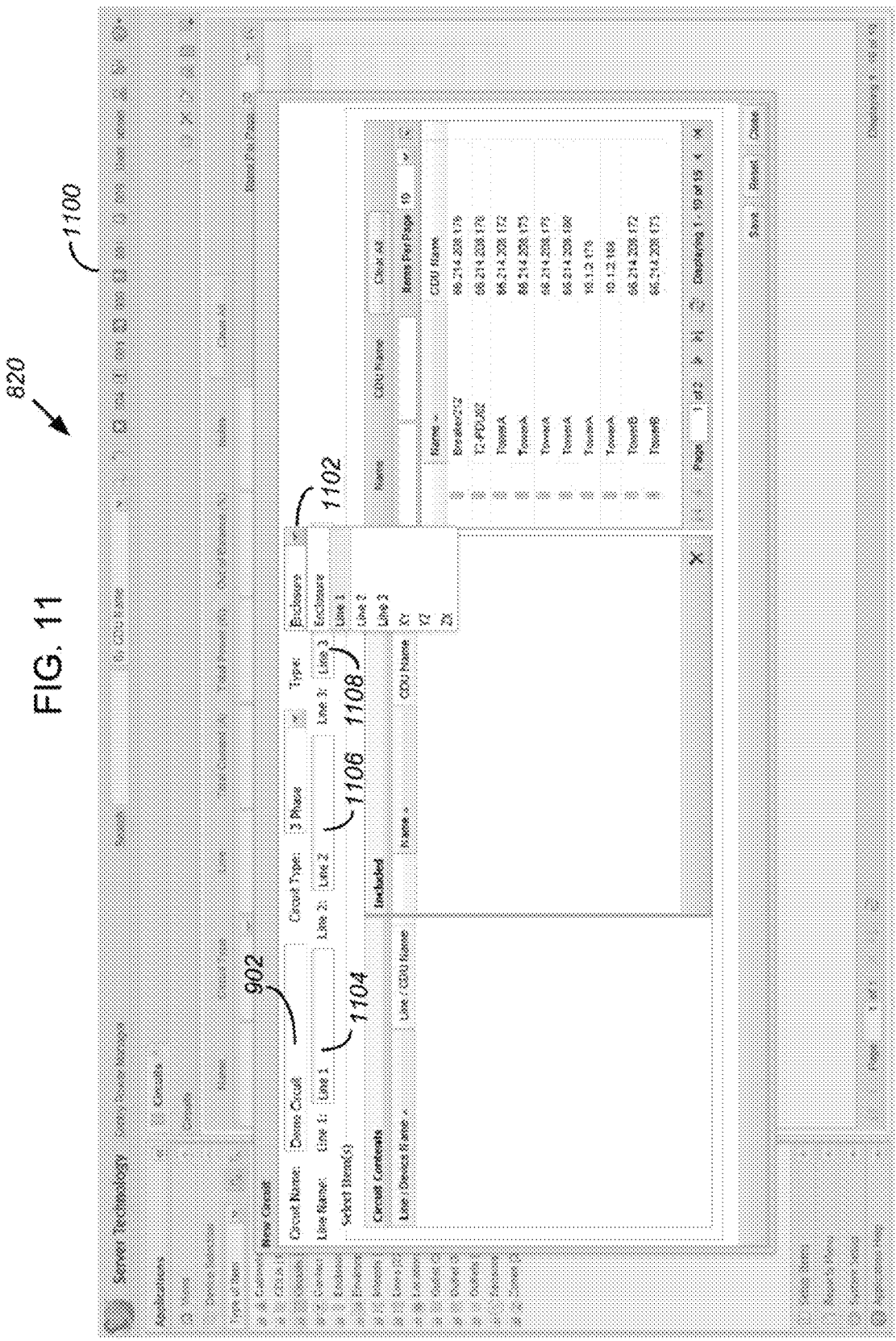
Figure 12:
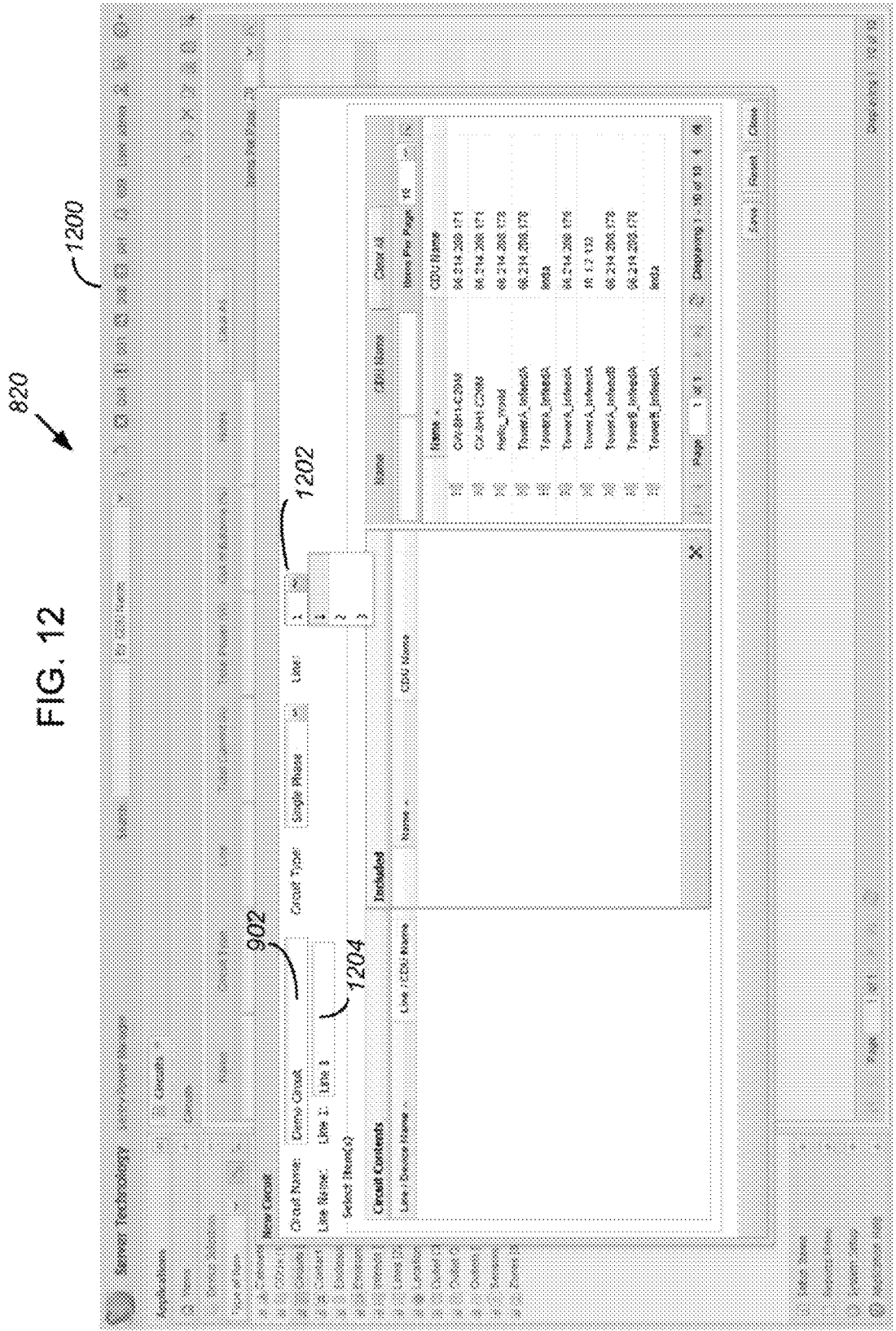

FIG. 8 illustrates a screen image 800 from which a New Circuit icon 802 may be graphically selected (or pressed) to start the process of entering a new circuit description via the GUI 820. FIG. 9 illustrates a New Circuit screen 900 that pops up following a press of the New Circuit button 802. The New Circuit screen 900 includes a text field 902 for receiving a name of a new power feed circuit. The New Circuit screen 900 also includes a drop-down selection tool 904 for selecting a Circuit Type. As shown in the screen image 1000 of FIG. 10, the Circuit Type selections may include a Single Phase circuit type and a 3 Phase circuit type. Upon selecting a 3 Phase circuit type, a drop-down selection tool 1102 may be provided for selecting three-phase (Enclosure), two-phase (XY, YZ or ZX) or single-phase (Line 1, Line 2, Line 3) connections of PDU infeeds to the 3 Phase circuit. See, FIG. 11. Line name text fields 1104, 1106, 1108 may be provided for receiving custom names for the various lines included in a three-phase circuit. If Enclosures (e.g., racks or CDUs) are specified, the manner in which they are connected to a 3 Phase circuit may be retrieved from information that is maintained by, retrieved by, or input into a network power manager. Upon selecting a Single Phase circuit type (see FIG. 12), a user may be provided with a drop-down selection tool 1202 for selecting which line of primary input power the Single Phase circuit is derived from, as well as a Line Name text field 1204 for receiving a name of the single-phase line included in the Single Phase circuit.

Figure 13:
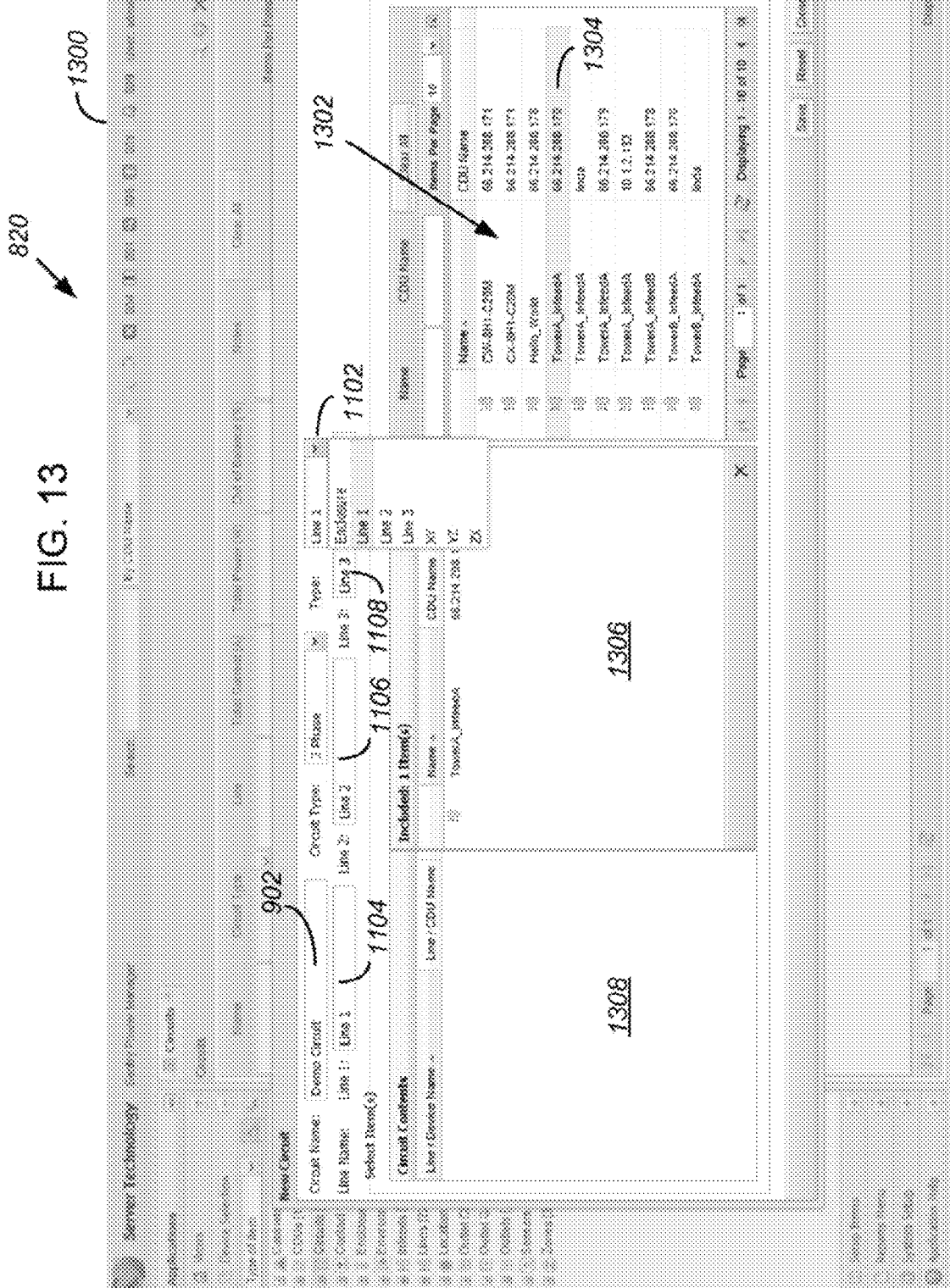

Once a Circuit Type and Line have been selected, a user may select one or more infeeds from a list 1302 of provided or discovered infeeds. See, e.g., the screen image 1300 shown in FIG. 13. A selected infeed 1304 may be dragged and dropped into an Included window 1306, thereby indicating that a connection exists between the infeed and the selected circuit and line. Upon saving the set of included infeeds, the lines and devices connected to the infeeds listed in the Included window 1306 are populated in the Circuit Contents window 1308. By way of example, infeeds are identified in the list of infeeds 1302 by their infeed Name and corresponding CDU Name. In the example screen, a CDU Name takes the form of an internet protocol (IP) address of the CDU. An infeed Name may be changed by first selecting it using, for example, two mouse clicks having a particular time relation. FIG. 13 shows a specification of interconnections between a number of PDU infeeds (e.g., TowerA_InfeedA) and a particular line of power (e.g., Line 1) in a particular power feed circuit (e.g., Demo Circuit).

Figure 14:
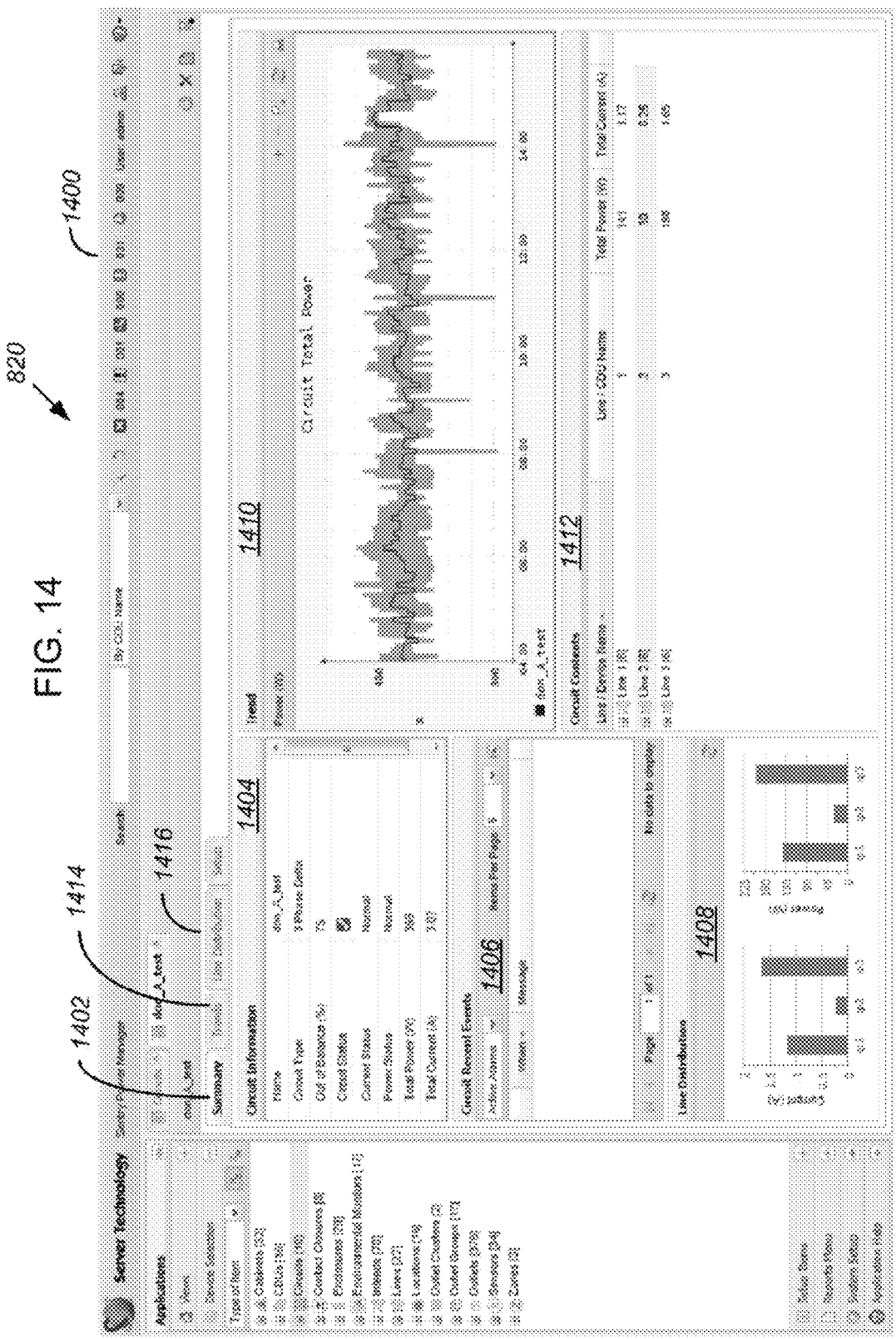

Having described how the screens shown in FIGS. 8-13 may be used to enter a number of circuit descriptions into a GUI 820 of a power usage monitoring system, a couple of screens 1400, 1500 for monitoring power usage will now be described. FIG. 14 illustrates a first of these screens. The screen 1400 provides a Summary tab/frame 1402 for the don_A_test circuit. The frame 1402 includes sub-frames labeled Circuit Information 1404, Circuit Recent Events 1406, Line Distribution 1408, Trend 1410 and Circuit Contents 1412. The Circuit Information sub-frame 1404 provides, for example, the Name of the circuit, the percentage which it is Out of Balance (in the case of a three-phase circuit type), and Circuit Status, Current Status and Power Status indicators. The Circuit Recent Events sub-frame 1406 lists recent circuit events of interest, such as Alarms that have triggered. The Line Distribution sub-frame 1408 provides a phase distribution chart for both current and power. This information is especially useful for load balancing power between the different phases. The Trend sub-frame 1410 provides a trend chart, and by way of example shows Circuit Total Power over time. The trend chart is useful in analyzing the effects of PDUs and/or their powered equipment being powered up, powered down, or used to varying degrees (e.g., at peak and non-peak usage times). This information is especially useful for capacity planning. The Circuit Contents sub-frame 1412 provides a summary of total power and total current per line of power in a circuit and provides an expandable menu for expanding or collapsing the contents (e.g., infeeds) of each line of power. The Trend and Line Distribution tabs 1414, 1416 may be respectively selected to see enlarged or alternate trend and line distribution charts or information.

Figure 15:
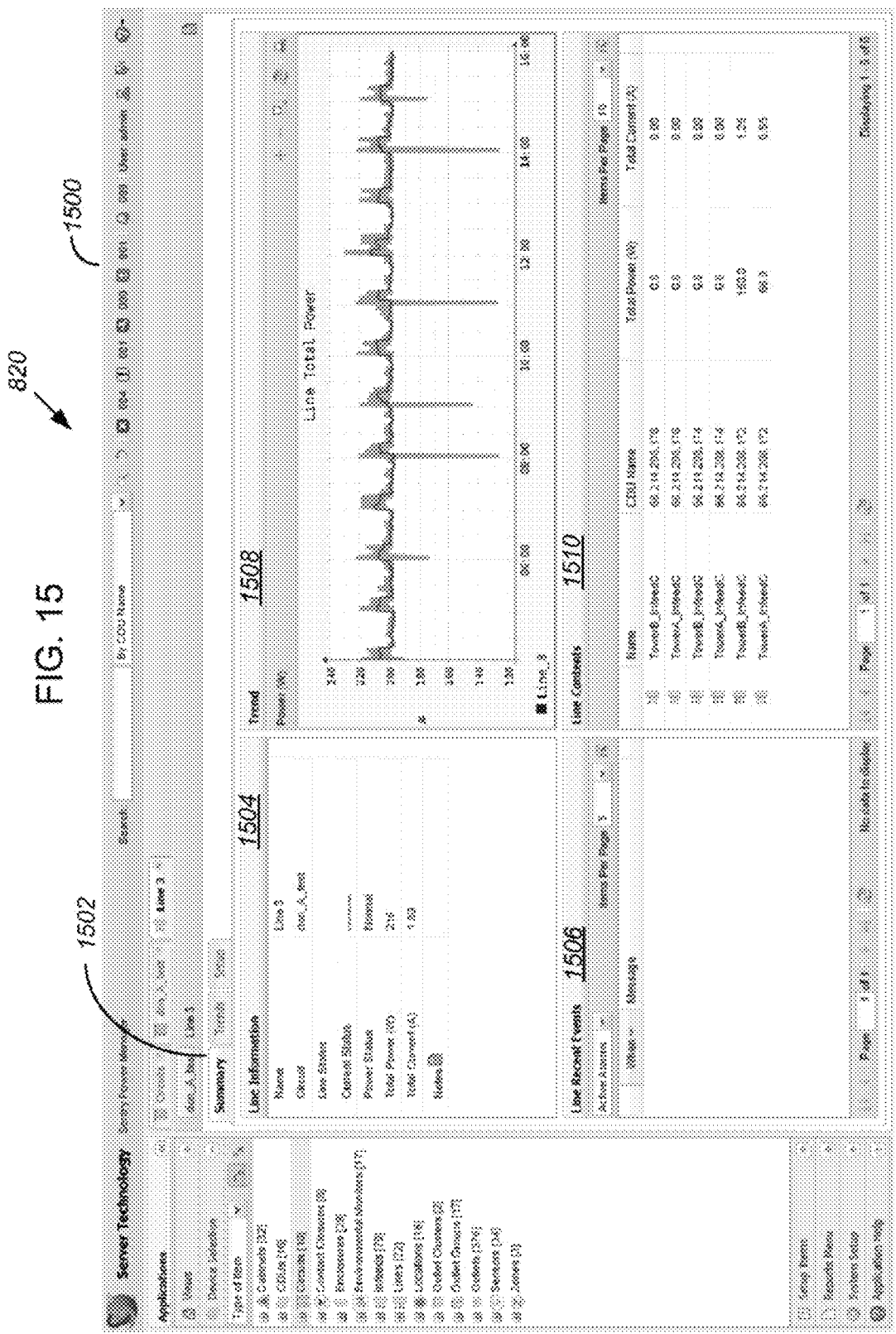

The screen 1500 shown in FIG. 15 provides a Summary tab/frame 1502 for a single line of power named "Line 3". The frame 1502 includes sub-frames labeled Line Information 1504, Line Recent Events 1506, Trend 1508 and Line Contents 1510. The Line Information sub-frame 1504 provides, for example, the Name of the line, the name of the Circuit the line belongs to, Line Status, and Current Status and Power Status indicators. The Line Recent Events sub-frame 1506 lists recent line events of interest, such as Alarms that have triggered. The Trend sub-frame 1508 provides a trend chart, and by way of example shows Line Total Power over time. The trend chart is useful in analyzing the effects of PDUs and/or their powered equipment being powered up, powered down, or used to varying degrees (e.g., at peak and non-peak usage times). The Line Contents sub-frame 1510 provides a summary of total power and total current used per infeed connected to the selected line of power. The Trend tab 1512 may be selected to see an enlarged or alternate trend charts or information.

In some cases, the GUI 820 shown in FIGS. 8-15 may be generated by the processing unit 708 shown in FIG. 7. For purposes of this description, a GUI is considered to be generated by a processing unit regardless of whether the processing unit plays a higher level or lower level role in generating the GUI. For example, a processing unit may generate a GUI displayable on a display by assembling and outputting substantial parts or all of the GUI's screen images. In other embodiments, for example, a processing unit may simply provide instructions that cause memory, video or other subsystems to assemble or output appropriate screen images at appropriate times.

Figure 16:
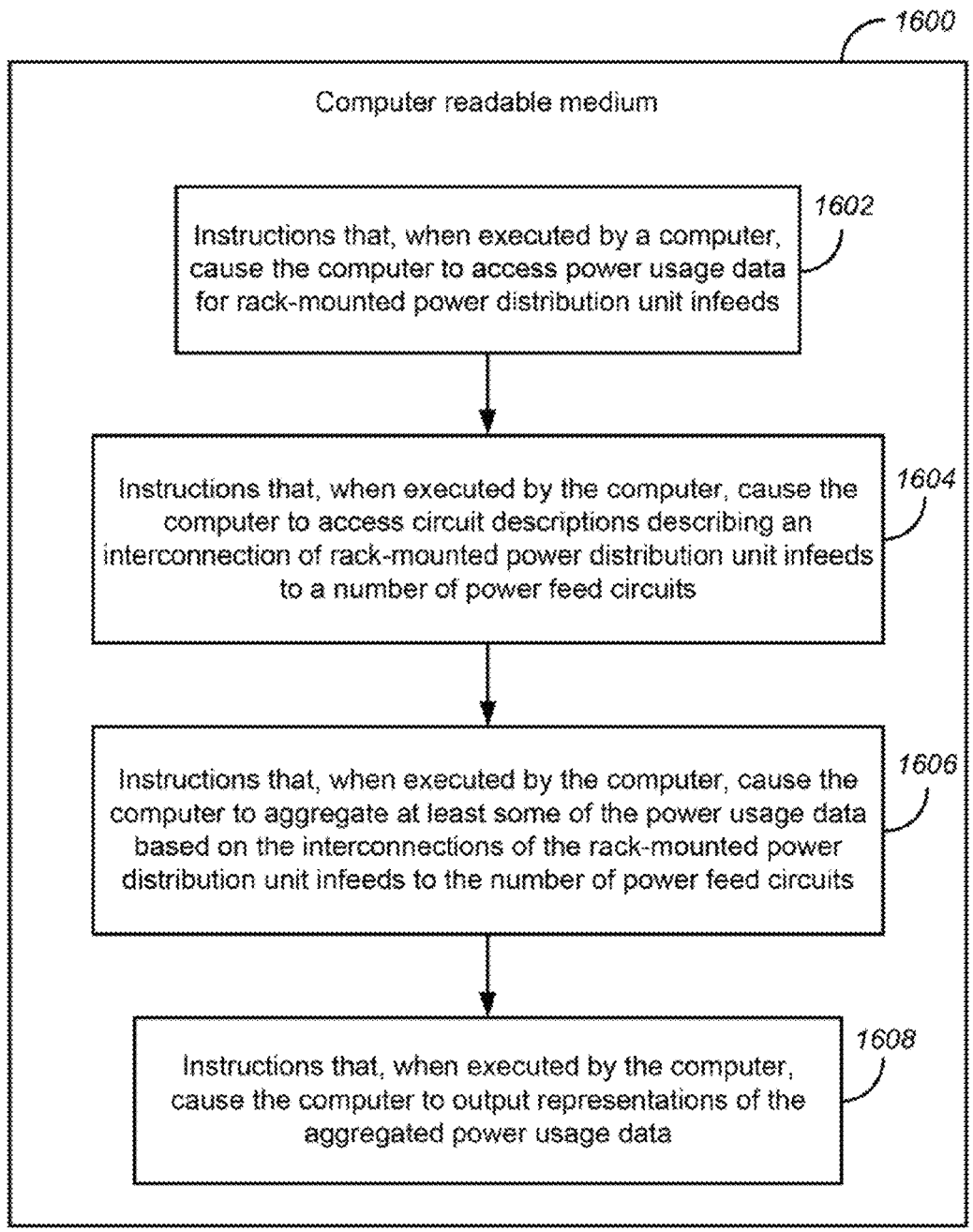
FIG. 16 illustrates a computer readable medium storing instructions that, when executed by a computer, cause the computer to instantiate a power usage monitor.

In some cases, software, firmware, middleware, microcode, a hardware description language for instantiating a power usage monitor may be provided on a computer readable medium 1600. See, FIG. 16. In particular, the computer readable medium 1600 may store instructions 1602, 1604, 1606, 1608 that, when executed by a computer, cause the computer to: 1) access power usage data of rack-mounted power distribution unit infeeds 1602 (e.g., over a network or in a database); 2) access stored circuit descriptions describing interconnections of the rack-mounted power distribution unit infeeds to a number of power feed circuits 1604 (e.g., in a database); 3) aggregate at least some of the power usage data based on the interconnections of the rack-mounted power distribution unit infeeds to the number of power feed circuits 1606; and 4) output representations of the aggregated power usage data 1608. For purposes of this description, a "computer" is any system of device that is capable of executing instructions, such as, but not limited to: a server, a workstation, a personal computer, a mobile phone, a tablet computer, or a master PDU that receives power usage data from other PDUs. A "computer readable medium" is any medium capable of storing instructions that are executable by a computer, including, but not limited to: a portable or fixed storage device, an optical storage device, a wireless channel, a SIM card, other smart cards, and various other mediums capable of storing, containing or carrying instructions or data. Some of these computer readable mediums are non-transitory.

Figure 17:
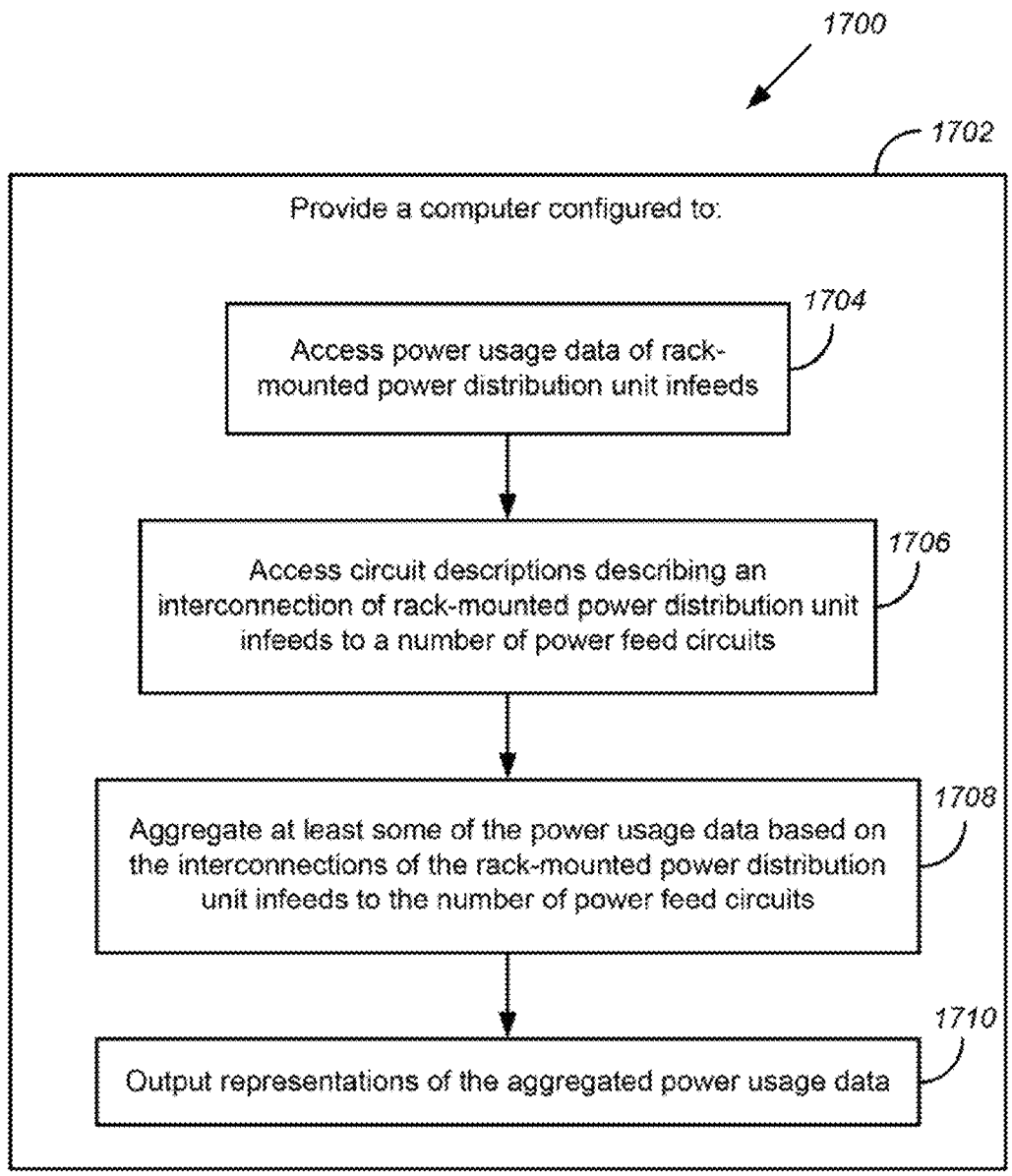
FIG. 17 illustrates a method of facilitating power usage monitoring.

In some cases, a method 1700 of facilitating power usage monitoring of power feed circuits may comprise providing a computer 1702 programmed to: 1) access power usage data of rack-mounted power distribution unit infeeds 1704; 2) access circuit descriptions describing an interconnection of rack-mounted power distribution unit infeeds to a number of power feed circuits 1706; 3) aggregate at least some of the power usage data based on the interconnections of the rack-mounted power distribution unit infeeds to the number of power feed circuits 1708; and 4) output representations of the aggregated power usage data 1710. See, FIG. 17.

The systems, devices, methods, and software described herein are useful not only for monitoring the power usage of power feed circuits that supply power to equipment racks in a data center, but are useful in mapping and managing the physical infrastructure of the power systems feeding one or many electrical equipment racks, thereby enabling a user to determine where losses in efficiency exist as a result of conditions such as power system overload, underuse or imbalance. These conditions can exist, and can be monitored, at the PDU level, at the cabinet level, within a row of cabinets, within a zone, or at any other group, level or location that a user defines.

Although the examples provided herein focus on power usage monitoring for the power feed circuits that supply power to rack-mounted PDUs, the teachings herein also apply to power usage monitoring for other types of power feed circuits, such as the power feed circuits that supply power to floor-mounted and other types of PDUs. That said, peculiar advantages can be realized by aggregating the power usage data of rack-mounted power distribution unit infeeds. For example, rack-mounted PDUs are typically the most downstream PDU of a power distribution system, and thus, the power flowing through these PDUs is impacted by the power flowing through the entire power supply chain. Furthermore, for example, rack-mounted PDUs tend to be the most numerous type of PDU in a data center or similar facility. Collecting data at the numerous infeeds of these PDUs therefore provides the most data points for assessing the distribution and balance of power in a data center.

It should be noted that the methods, systems, devices and computer readable mediums discussed above are intended merely to be examples. It must be stressed that various embodiments may omit, substitute, or add various procedures or components as appropriate. For instance, it should be appreciated that, in alternative embodiments, the methods may be performed in orders different from that described, and that various procedures may be added, omitted or combined. Also, features described with respect to certain embodiments may be combined in various other embodiments. Different aspects and elements of the embodiments may be combined in a similar manner. Also, it should be emphasized that technology evolves and, thus, many of the elements are exemplary in nature and should not be interpreted to limit the scope of the invention.

Specific details are given in the description to provide a thorough understanding of the embodiments. However, it will be understood by a person of ordinary skill in the art that the embodiments may be practiced without these specific details. For example, well-known circuits, processes, algorithms, structures, and techniques have been shown without unnecessary detail in order to avoid obscuring the embodiments.

Also, it is noted that certain embodiments are described using flow diagrams or block diagrams. Although each may describe procedures or operations that occur sequentially, many of the procedures or operations can be performed in parallel or concurrently. In addition, the order of the procedures or operations may be rearranged. A process may also have additional steps not included in the figure.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a computer readable medium. A processing unit may perform the necessary tasks.

Having described several embodiments, it will be recognized by those of skill in the art that various modifications, alternative constructions, and equivalents may be used without departing from the spirit of the invention. For example, the above elements may merely be components of a larger system, wherein other rules may take precedence over or otherwise modify the application of the invention. Also, a number of steps may be undertaken before, during, or after the above elements are considered. Accordingly, the above description should not be taken as limiting the scope of the invention.

What is claimed is:

1. A power usage monitoring system, comprising:
a circuit description receiving interface receiving at least one circuit description describing interconnections of a first power distribution unit infeed to a first power feed circuit and a second power distribution unit infeed to a second power feed circuit;
a power usage communication interface receiving first power usage data for the first power distribution unit infeed and second power usage data for the second power distribution unit infeed;
a memory subsystem storing the received at least one circuit description, the first power usage data, and the second power usage data; and
a processing unit interconnected with the circuit description receiving interface, the power usage communication interface, and the memory subsystem, the processing unit programmed to receive the at least one circuit description, the first power usage data, and the second power usage data, aggregate at least the first power usage data and the second power usage data based on the interconnections of the first power distribution unit infeed to the first power feed circuit and the second power distribution unit infeed to the second power feed circuit, and output representations of aggregated power usage data.

2. The power usage monitoring system of claim 1, wherein the first power feed circuit is associated with a first power line and the second power feed circuit is associated with a second power line.

3. The power usage monitoring system of claim 1, wherein the at least one circuit description associates a first power distribution unit with the first power feed circuit and a second power distribution unit with the second power feed circuit.

4. The power usage monitoring system of claim 1, wherein the processing unit communicates with a number of power distribution units, over a network, via the power usage communication interface.

5. The power usage monitoring system of claim 1, wherein the processing unit communicates via the power usage communication interface with a data store in which one or more of the first power usage data, the second power usage data, or the aggregated power usage data is stored.

6. The power usage monitoring system of claim 1, further comprising a display on which the representations of the aggregated power usage data are displayed.

7. The power usage monitoring system of claim 1, wherein the processing unit is programmed to output the representations of the aggregated power usage data as data points for generating a trend chart on a display.

8. The power usage monitoring system of claim 1, wherein the processing unit is programmed to output the representations of the aggregated power usage data as data points for generating a phase distribution chart on a display.

9. The power usage monitoring system of claim 1, further comprising a network interface over which the representations of the aggregated output power usage data are transmitted.

10. The power usage monitoring system of claim 1, wherein the representations of the aggregated power usage data include power usage values.

11. The power usage monitoring system of claim 1, wherein the representations of the aggregated power usage data include power usage status indicators.

12. The power usage monitoring system of claim 1, wherein the first power usage data includes first power readings and the second power usage data includes second power readings.

13. The power usage monitoring system of claim 1, wherein the first power usage data includes first current readings and the second power usage data includes second current readings.

14. The power usage monitoring system of claim 1, wherein the processing unit is further programmed to generate a graphical user interface, the graphical user interface exposing the circuit description receiving interface to a user of a display and providing graphical tools for associating the first power distribution unit infeed with the first power feed circuit and the second power distribution unit infeed with the second power feed circuit.

15. The power usage monitoring system of claim 14, wherein the first power feed circuit is associated with a first power line and the second power feed circuit is associated with a second power line.

16. A power usage monitoring system, comprising:
a circuit description receiving interface receiving at least one circuit description describing interconnections of a first infeed of a power distribution unit to a first power feed circuit and a second infeed of the power distribution unit to a second power feed circuit;
a power usage communication interface receiving first power usage data for the first infeed and second power usage data for the second infeed;
a memory subsystem storing the received at least one circuit description, the first power usage data, and the second power usage data; and
a processing unit interconnected with the circuit description receiving interface, the power usage communication interface, and the memory subsystem, the processing unit programmed to receive the at least one circuit description, the first power usage data, and the second power usage data, aggregate at least the first power usage data and the second power usage data based on the interconnections of the first infeed to the first power feed circuit and the second infeed to the second power feed circuit, and output representations of aggregated power usage data.

17. A non-transitory computer readable medium storing instructions that, when executed by a computer, cause the computer to:
access first power usage data for a first power distribution unit infeed;
access second power usage data for a second power distribution unit infeed;
access at least one stored circuit description describing interconnections of the first power distribution unit infeed to a first power feed circuit and the second power distribution unit infeed to a second power feed circuit;
aggregate at least the first power usage data and the second power usage data based on the interconnections of the first power distribution unit infeed to the first power feed circuit and the second power distribution unit infeed to the second power feed circuit; and
output representations of aggregated power usage data.

18. A non-transitory computer readable medium storing instructions that, when executed by a computer, cause the computer to:
access first power usage data of a first infeed of a power distribution unit;
access second power usage data of a second infeed of the power distribution unit;
access at least one stored circuit description describing interconnections of the first infeed to a first power feed circuit and the second infeed to a second power feed circuit;
aggregate at least the first power usage data and the second power usage data based on the interconnections of the first infeed to the first power feed circuit and the second infeed to the second power feed circuit; and
output representations of aggregated power usage data.

19. A method of monitoring power usage, comprising:
accessing first power usage data for a first set of infeeds of a plurality of units;
accessing second power usage data for a second set of infeeds of the plurality of power distribution units;
accessing stored circuit descriptions describing interconnections of the first set of infeeds to a first power feed circuit and the second set of infeeds to a second power feed circuit;
transforming the plurality of power distribution units into a power usage monitor for monitoring power usage of the first and second power feed circuits by aggregating at least the first and second power usage data based on the interconnections of the first set of infeeds to the first power feed circuit and the second set of infeeds to the second power feed circuit; and
outputting representations of aggregated power usage data.

20. A method of facilitating power usage monitoring, comprising:
provinding a computer programmed to
access first power usage data for a first power distribution unit infeed;
access second power usage data for a second power distribution unit infeed;
access at least one circuit description describing interconnections of the first power distribution unit infeed to a first power feed circuit and the second power distribution unit infeed to a second power feed circuit;
aggregate at least the first power usage data and the second power usage data based on the interconnections of the first power distribution unit infeed to the first power feed circuit and the second power distribution infeed to the second power feed circuit; and
output representations of aggregated power usage data.

* * * * *